(12) United States Patent
Favaron et al.

(10) Patent No.: US 10,215,065 B2
(45) Date of Patent: Feb. 26, 2019

(54) VALVE FOR INTERNAL COMBUSTION ENGINES

(71) Applicants: Mahle Metal Leve S/A, Jundiai-Sp (BR); Mahle International GmbH, Stuttgart (DE)

(72) Inventors: Rodrigo Favaron, Sao Paulo (BR); Vinicius Bossoni Do Amaral, Tubingen (DE)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 566 days.

(21) Appl. No.: 14/439,506

(22) PCT Filed: Oct. 31, 2013

(86) PCT No.: PCT/BR2013/000450
§ 371 (c)(1),
(2) Date: Apr. 29, 2015

(87) PCT Pub. No.: WO2014/066966
PCT Pub. Date: May 8, 2014

(65) Prior Publication Data
US 2015/0292370 A1      Oct. 15, 2015

(30) Foreign Application Priority Data
Oct. 31, 2012   (BR) .............................. 102012028060

(51) Int. Cl.
*B32B 15/00*   (2006.01)
*F01L 3/04*    (2006.01)
*C23C 16/30*   (2006.01)

(52) U.S. Cl.
CPC ................ *F01L 3/04* (2013.01); *C23C 16/30* (2013.01); *F01L 2101/00* (2013.01)

(58) Field of Classification Search
CPC ......... F01L 3/04; F01L 2101/00; F01L 1/047; F01L 1/16; F01L 2001/0475;
(Continued)

(56) References Cited

U.S. PATENT DOCUMENTS 3,900,592 A * 8/1975 Kennedy ............. C23C 14/0021
427/249.19
4,902,535 A   2/1990 Garg et al.
(Continued)

FOREIGN PATENT DOCUMENTS

EP            1158070 A1 * 11/2001   ......... C23C 16/0281

OTHER PUBLICATIONS

Zhuk, Y., Materials Science and Techonogy Conference, Sep. 16-20, 2007, pp. 1-12.*
(Continued)

*Primary Examiner* — David Sample
*Assistant Examiner* — Elizabeth Collister
(74) *Attorney, Agent, or Firm* — Fishman Stewart PLLC (57) ABSTRACT

A valve device for an internal combustion engine may include a valve and a metallic tungsten matrix coating containing at least one tungsten nanocarbide disposed on at least a portion of the valve via a chemical vapor deposition (CVD) process. The coating may include a thickness ranging from 5 μm to 150 μm and a hardness between 500 HV and 2000 HV.

17 Claims, 5 Drawing Sheets

(58) Field of Classification Search
CPC .............. F01L 2103/00; F01L 2103/01; F01L 2820/01; C23C 16/30; C23C 16/029; C23C 16/04; C23C 16/26; F16H 53/025
USPC ........................................................ 428/660
See application file for complete search history.

(56) References Cited

U.S. PATENT DOCUMENTS

| | | | |
|---|---|---|---|
| 5,064,728 A | | 11/1991 | Sunder et al. |
| 5,771,873 A | | 6/1998 | Potter et al. |
| 6,800,383 B1 * | | 10/2004 | Lakhotkin ............ C23C 16/0281 427/255.7 |
| 7,011,067 B2 * | | 3/2006 | Savel, III .................. C25D 7/00 123/188.3 |
| 2009/0117372 A1 | | 5/2009 | Zhuk et al. |

OTHER PUBLICATIONS

Zhuk, Yuri, Int.Journal of Microstructure and Materials Properties, vol. 2 (1), 2007, pp. 90-98.*
Hardide, Key Properties of Hardide-T, https://hardide.com/technical/datasheets/, Capture from Wayback Machine Oct. 21, 2013, p. 1.*
Zhuk, Yuri., Advanced Materials & Processes, Aug. 2011, pp. 21-24.*
Lakhotkin, Yu V. et al., "Hard Corrosion-Resistant Coatings for Constructional Applications", Frumkin Institute of Physical Chemistry and Electrochemistry, Russian Academy of Science, Moscow Russia.
Chinese Office Action for CN-201380054558.1, dated Aug. 18, 2016.

\* cited by examiner

VALVE FOR INTERNAL COMBUSTION ENGINES

CROSS-REFERENCE TO RELATED APPLICATIONS

This application claims priority to Brazilian Patent Application No. 10 2012 028060-4, filed Oct. 31, 2012, and International Patent Application No. PCT/BR2013/000450, filed Oct. 31, 2013, both of which are hereby incorporated by reference in their entirety.

TECHNICAL FIELD

The present invention relates to a valve for use on an internal combustion engine, at least one of the valve portions receives a coating by the chemical vapor deposition (CVD) process, which imparts to the resulting valve long durability, simplification in the manufacture and resistance to corrosion and fracture.

BACKGROUND

Internal combustion engines are energy transforming mechanism used by the vast majority of automotive vehicles and comprise basically two main parts: one of more engine heads and the engine block. On the base of the head (s) are located the combustion chambers (in Diesel engines, in general, the combustion chambers are located on the piston heads) and on the engine block are located the cylinders and the crankshaft assembly. Valves of an internal combustion engine are housed in the head (s) and are a device that aims at allowing or blocking the entry or exit of gases in the engine cylinders.

The engine converts the energy produced by combustion of the (fuel and air) mixture in the combustion chambers to mechanical energy capable of imparting movement to the wheels. Intake valves are those that control the entry of gaseous mixture into the engine cylinder, and escape valves are those that permit exit of the gases after the explosion.

Figure 1:
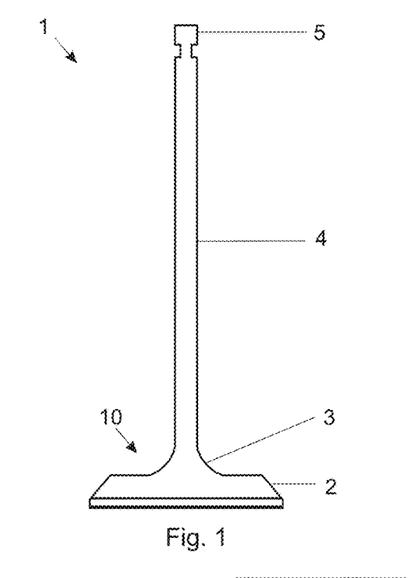
FIG. 1 is a schematic side view of a valve with the elements that constitute it.
Figure 2:
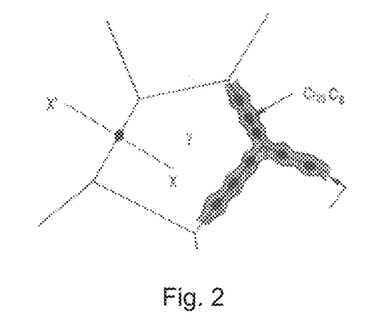
FIG. 2 is a schematic view exemplifying the intergranular corrosion mechanism through impoverishment of the chrome in the border grain regions of a prior-art valve FIG. 3 corresponds to a photograph exemplifying the intergranular corrosion on a prior-art valve FIG. 4 corresponds to a photograph exemplifying intergranular corrosion and the occurrence of secondary fractures on a prior-art valve.
Figure 3:
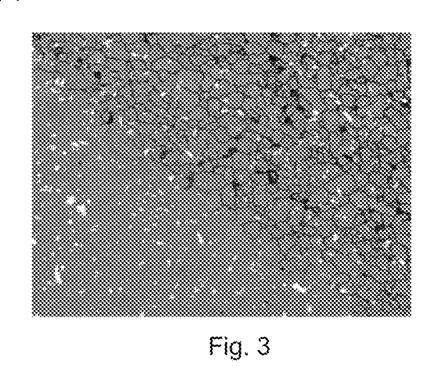
Figure 4:
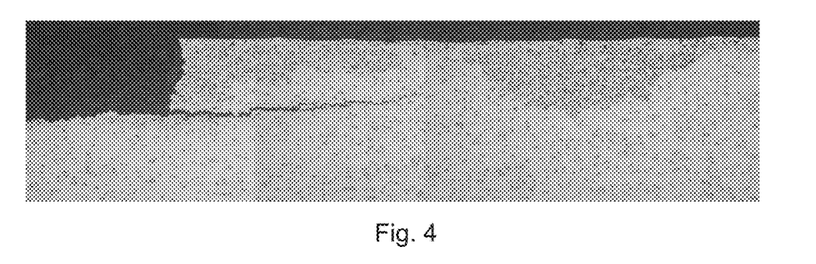

By reason of the different stresses to which a valve is subjected, its constructive configuration is, in general, very similar. Thus, as can be seen in FIG. 1, a valve 1 is constituted by a disc-shaped head 10 that comprises a seat region 2 and a neck region 3 that acts as a transition region for the rod 4, wherein at the rod end opposite the head is located the valve 1 tip 5.

Each valve portion is subjected to different working conditions, thus being stressed in different manners. The seat region is subjected to wear by impact and friction, its function being that of sealing against the seat/insert present on the head. It should be noted that, besides the wear by impact upon closing the valve, there is also wear by friction (adhesion when the valve turns in contact with the insert). The head region, in turn, should be resistant to corrosion. The rod region should be resistant to the wear and have low friction. It should be noted that as little amount of lubricating fluid as possible should pass through the region between the rod and the guide, in order to prevent the lubricant from reaching the combustion chamber. Finally, the valve tip has to be resistant to wear, since it receives constant pressure on the part of the actuator that forces the valve to open and close.

In short, valves should exhibit resistance to three different types of stresses, namely: mechanical, thermal and chemical. With regard to mechanical resistance, valves should exhibit impact resistance in the seat region and in the tip region. Regarding resistance to wear, the main parts affected are the seat region, the rod and the valve tip. In turn, resistance to pressure should be a characteristic of the head front. Finally, the fatigue strength, it is necessary due to the constant alternation between the traction stress and the compression stress.

The need for heat resistance results from the combustion temperature, from the high temperatures of the escape gases and from the fatigue caused by the alternation between high and low temperatures.

The chemical resistance becomes necessary to prevent corrosion, which occurs easily in the corrosive environment of gases, moisture and working temperatures to which a valve is subjected.

Thus, with a view to overcome the more and more demanding working conditions to which valves are subjected, it is also common for valves to be monometallic of special alloys, bimetallic or provided with inserts.

Monometallic valves are constituted by a single material and are applied to moderate requirement parts. Thus, for intake valves, one usually employ martensitic steels, preferably of chrome-silicon alloys, because of their excellent mechanical properties. With regard to escape valves, one usually makes use of chrome-nickel-manganese alloy steels because of the excellent properties of resistance to corrosion and to high temperatures.

Bimetallic valves have applications in situations of greater requirement, in which a specific material is applied for each valve part. By way of example, one uses a martensitic steel is used on the rod, in order to guarantee high resistance to wear. With regard to the head, one uses austenitic steel or a nickel-based alloy to guarantee resistance to corrosion at high temperatures. Naturally, these valves have a higher cost due to their manufacture process, exhibiting limitations and, therefore, not being justifiable for many of the applications.

The valve tip usually receives, by means of welding, an austenitic-alloy tablet (in this case of a monometallic valve) and of low-alloy hard-tempered austenitic steel (in this case, of bimetallic valve).

At present, the need for higher thermal efficiency and specific power of engine, markedly due to the limits of emission of pollutants and consumption of fuel and lubricating oil, has led to an increase in thermal stresses of Otto or Diesel engines, among which are valves. This, in some more recent applications, the reduction in durability of these components has been considerable, calling for improvements.

Until now, among the most common solutions of coating valves of prior-art engines, one can cite nitriding, which exhibits a negative performance regarding fatigue resistance, for instance. Another example is the case of titanium valves, which are used for race-car engines, but ham a very high cost and low resistance to wear, for which reason their surface should be coated with a titanium nitride (TiN) or titanium oxide (TiO) in order to offset the low resistance to wear.

There are still a few additional solutions for engine valves that make use of commercially known alloys such as Nimonic or Nireva alloys, but the cost of these materials does not compensate for the properties offered for most situations.

Among the various prior-art solutions, document U.S. Pat. No. 4,811,701 discloses an intake valve for an internal combustion engine provided with a cerium oxide coating, applied by thermal spray with a view to prevent formation of carbon deposited on the valve.

Document U.S. Pat. No. 7,562,647 discloses an inlet valve having a coating resistant to high temperatures, as well as an internal combustion engine provided with such a valve. The valve is partly coated so as to guarantee resistance to corrosion, receiving also a head hardening treatment. The protective film disclosed deals generically with a curable resin, including at least one metallic or ceramic material and at least one organic or inorganic binding agent.

Document U.S. Pat. No. 5,441,235 discloses a titanium-nitride coated valve, as well as its production method. The titanium valve is basically nitride, but in reality one does deposit a TiN film, but rather only pressurized nitrogen reaction with titanium takes place on the valve surface. Since this is a diffusion process, high temperatures—from 700 to 880° C.—occur, for achieving an adequate formation of nitrides. This process is based on an arch established between cathode and the valve (anode), losing efficiency and perhaps causing non-conformity of the film by the tip effect (which accumulate load). Thus, as a drawback of this prior-art document, there is the non-suitability of the process for coating steels, due exactly to high temperature.

U.S. Pat. No. 7,225,782 too discloses a valve that receives a titanium nitride treatment, applied by physical vapor deposition (PVD) with a view to promote a protective oxide film on the valve surface. The document also comments on the possibility of using a film of DLC, chromine nitride or WC/C deposited by PVD. With regard to the WC/C coating, one mentions the formation of multiple layers of tungsten carbide alternating with amorphous carbon layers. However, the PVD method has exhibits a number of difficulties regarding a homogeneous deposition, which results in an undesired behavior with respect to resistance of the valve to wear. Another disadvantage of the PVD process is the difficulty in depositing the coating onto all faces of the piece, called anode, since the PVD process requires that the anode faces to be coated should be exposed frontally to the cathode, source of material of the PVD.

Multilayer films deposited by PVD often have high residual stresses, especially DLC films. Although they have good properties with regard to friction, DLC does not resist to high temperatures, let alone those to which the valve will be subjected. It should also be noted that it does now work well in corrosive environments (DLCs usually have "pinholes" through which corrosion finds way as far as the substrate). It should also be noted that, in the case of WC/C by PVD, it is necessary to evaporate the tungsten from powder or targets, which requires much energy, since one should reach about 2500° C.

Thus, the solutions that make use of PVD have disadvantage with respect to the present invention. Unlike the PVD process, in the present CVD process used in the present invention, since this is a chemical deposition, in which the coating materials are introduced into the deposition chamber in the form of a gas, all the piece surface that are not protected will receive the coating, since the gas in the environment will react with the piece surface.

Even though there are a number of attempts to minimize the wear to which valves are subjected, the prior-art solutions do not provide a valve of internal combustion engine that concomitantly manages to exhibit a superior behavior in all the durability requirements.

A few examples that they affect the durability of the prior-art valves can be seen in FIGS. 2 to 7. Thus, one of the phenomena that affect the durability of the prior-art valves most result from intergranular corrosion (ITG).

The phenomenon may be described as corrosion that begins in the contour of the grain. Due to exposure to high temperature, the alloy chrome migrates to the contour of the grain, that is, there is formation of a chrome precipitate in the bordering region of the grain. As a result, the loss of chrome as an alloy element, which is essential to corrosion, leads to dissolution of the grain borders and of the adjacent regions (see FIGS. 3, 4, 6 and 7).

Figure 5:
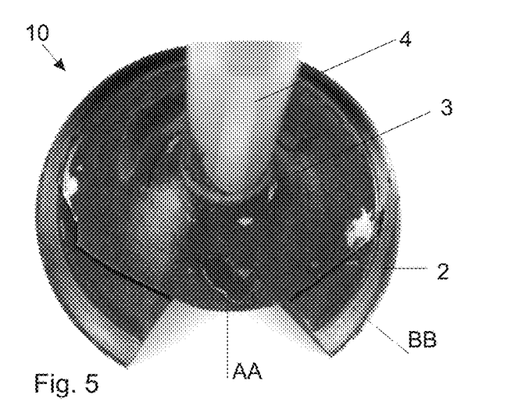
FIG. 5 is a perspective photograph of a prior-art valve from which a part of the head region has been lost due to a main fracture (substantially parallel to the perimeter) and secondary fractures (substantially orthogonal to the perimeter)

The result of such an effect leads to fracture of the valve, as shown in FIG. 5, which shows a prior-art valve where a part of the head region has been lost due to a main fracture (substantially parallel to the perimeter—see FIG. 6), showing secondary fractures (substantially orthogonal to the perimeter—see FIG. 4) as well.

Figure 6:
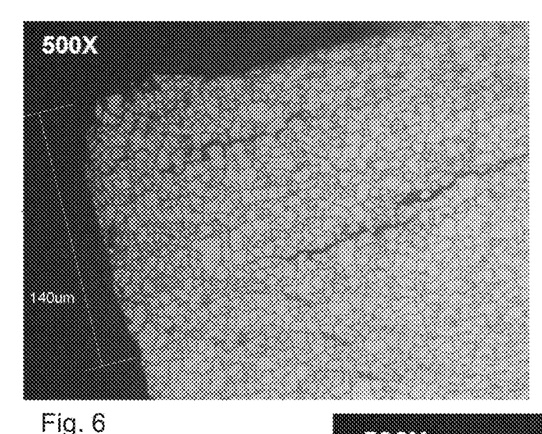
FIG. 6 is a photograph showing intergranular corrosion and removal of a few grains in the AA section of the valve illustrated in FIG. 5.
Figure 7:
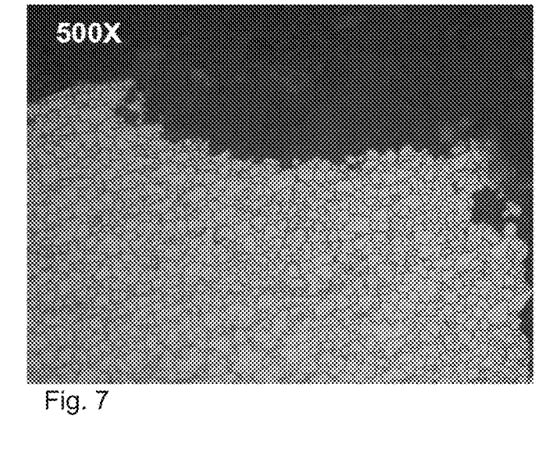
FIG. 7 is a photograph showing intergranular corrosion and removal of material in the BB section of the valve illustrated in FIG. 5.

FIGS. 6 and 7 illustrate in detail, the intergranular corrosion 500 times magnified, as well as the removal of a few grains from the AA and BB sections of FIG. 5, respectively.

Figures 8, 9:
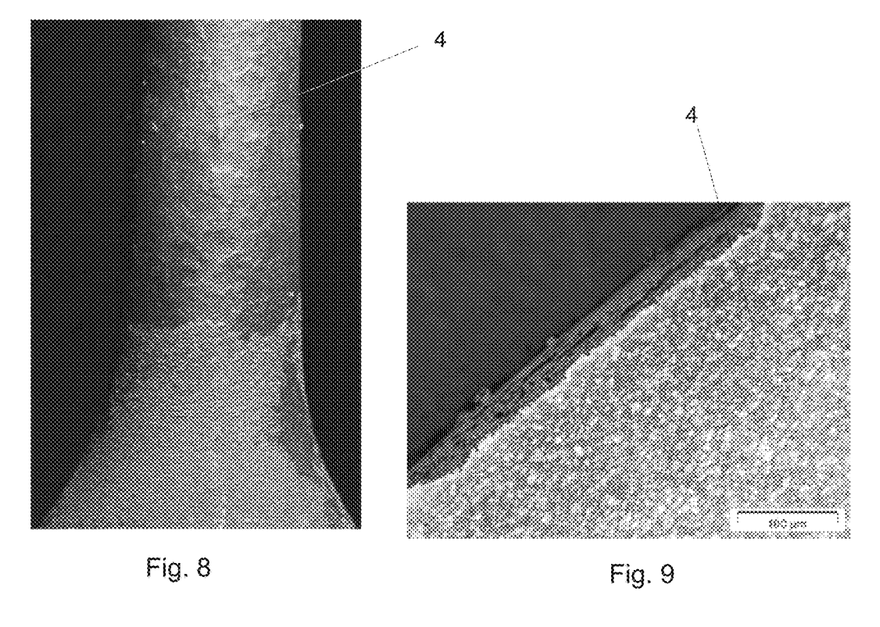
FIG. 8 is a photograph showing the rod region of a prior-art valve after hot gas corrosion.
FIG. 9 is a photograph showing the rod region of a prior-art valve after corrosion by hot gas and consequent removal of material.

Another wear mechanism that usually takes place on prior-art valves is known as hot gas corrosion (HGC). FIGS. 8 and 9 shows the occurrence of such phenomenon in a valve rod, and there may be removal of material from the rod surface.

The corrosion caused by the hot gas to which the valves are subjected is generally a uniform mechanism of corrosion associated, in most cases, to hot gases to which the exhaustion valves are subjected. It is generally related to oxidation, but attack by molten salts such as sulfiding (sulfide salts formed by the fuel and lubricating fluid) may also occur. Usually, the prior art tries to control this process of corrosion steel valves by forming highly adherent non-porous chrome-oxide layer, wherein the HGC phenomenon begins when the layer loses its protective capability.

Figure 10:
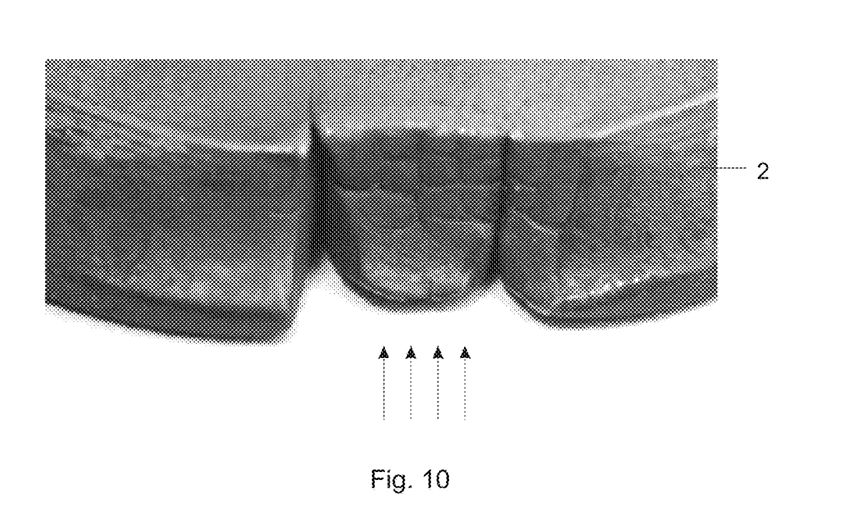
FIG. 10 is a photograph showing the rod region of a prior-art valve after corrosion by passage of gases heated by combustion and the consequent removal of material in the seat region.

A third common phenomenon that attacks valves is shown in FIG. 10. In this case, a failure in the valve that prevents rotary movement thereof may cause a small opening that allows passage of gases from combustion. These gases, in turn, lead to corrosion in the valve-seat region, since they have high temperature and are corrosive.

Such occurrence prevents the correct sealing which a valve should provide. In some cases, localized fusion may take place, which accelerates the corrosion phenomenon until the valve fails. This takes place because the constant passage of hot gases raises drastically the temperature in one localized and concentrated region (see arrows in FIG. 10), and it is impossible for that valve to enable correct operation of the engine. It should also be noted that this phenomenon has special incidence when the valve has sealing problems.

In the face of the foregoing, nobody had so far developed a valve to which a coating is applied by the chemical vapor deposition (CVD) process, imparting to the resulting valve long durability and keeping the manufacture cost acceptable.

SUMMARY

It is an objective of the present invention to provide a valve for use on internal combustion engines, wherein a tungsten carbide coating is applied by the chemical vapor deposition (CVD) process to at least a portion of the valve, at a temperature ranging from 450° C. to 650° C.

It is also an objective of the present invention to provide a valve formed by a single steel piece, which receives the tungsten carbide coating, making the productive process easier.

Finally, it is a further objective of the present invention to provide a valve that exhibits better resistance to wear in general, as well as resistance of the rod and seat face, is capable of resisting intergranular corrosion and subsequent fractures, resisting corrosion by passage of gases heated by the combustion and formation of leaks.

The objectives of the present invention are achieved by means of a valve for internal combustion engines, wherein a tungsten matrix metallic coating containing tungsten nanocarbides WC, W2C, W3C, W12C or a mixture thereof is applied to at least a portion of the valve, the coating having thickness ranging from 5 μm to 150 μm, hardness ranging from 500 HV to 2000 HV and being applied by the chemical vapor deposition (CVD) process.

BRIEF DESCRIPTION OF THE DRAWINGS

The present invention will now be described in greater detail with reference to an embodiment represented in the drawings.

DETAILED DESCRIPTION

FIG. 1 discloses a valve 1 for use on internal combustion engine, for example, an exhaustion valve or an intake valve. From this figure, which illustrates a side view, one can see clearly the existence of various parts that compose the valve 1, which is constituted by a disc-shaped head 10 that acts as a region of transition to the rod 4, wherein the rod end 4 opposite the head 10 is located at the tip 5 of the valve 1.

The valve of the present invention has, as its main innovation, the fact of receiving, on at least one of its parts, a tungsten carbide (WC) coating 7 applied by the chemical vapor deposition (CVD) process, which is not disclosed by any prior-art document and which imparts to the present valve superior durability characteristics and an extremely advantageous manufacture cost for the quality achieved.

As set forth above, wear of a valve, although for different reasons, has greater incidence on the head 10, in the seat region 2, in the neck region 3, on the rod 4 and at the tip 5 of the valve 1.

The tungsten carbide coating may be applied to any particular region of the valve, being preferably applied to the head 10, the seat region 2, the neck region 3, the rod 4 and/or the tip 5 of the valve 1. Alternatively, the coating 7 may be applied to the whole valve 1.

The application of the tungsten carbide coating 7 is especially suitable for the complex geometry of the valve 1, because it guarantees the deposition of a film in the desired thickness, in any portion that is exposed to the CVD process, thus guaranteeing an even and homogeneous deposition of the coating 7, in an easy and economical way.

The chemical vapor deposition (CVD) process is employed for applying coatings onto a given substrate 9. As a general rule, a substrate 9 is exposed in an environment where volatile elements react and deposit evenly throughout the exposed surface, thus being especially indicated for the valve 1.

Preferably, a number of segments of the valve 1 are located in the environment where the coating 7 will be applied. The valves 1 may be hung or placed with the head region 10 resting on a surface, or even in any other way that is suitable for this. It should be noted that the only rule to be observed is that the valve portion that promotes support for it (for instance, the head 10 resting on a surface) will not receive the treatment 7, since the surface of the valve 1 will not be exposed to the environment where the coating 7 will be applied. Thus, in a single piece, one manages to apply the coating onto a number of valves 1, which renders the manufacture of these components very economical.

Additionally, since the coating 7 is uniform throughout the valve 1 surface, the substrate 9 used may be a monometallic or bimetallic material of any more simple quality, with or without the tip 5 of the valve 1 welded. Among the substrates 9, one may use an inexpensive low-alloy and high-carbon steel, or a martensitic low-alloy steel, which exhibits excellent mechanical properties, or even an austenitic steel, which exhibits excellent working properties at high temperatures and resistance to corrosion.

As an advantage over the prior art, there is the possibility of increasing the amount of carbon in the alloy of the valve 1, which results in benefits regarding hardness and thermal stability of the material.

Moreover, when compared with the prior art, the obtainment of a monometallic valve 1 of the present invention dispenses with the joining processes described above, among which the joining between the head 10 and the rod 4, or between the rod 4 and the tip 5 of the valve 1, guaranteeing a valve 1 of superior durability. Although not compulsory, the valve of the present invention can dispense with welding of the tip 5. Moreover, the need for inserts and hardening treatments is eliminated, since the valve as a whole will receive the tungsten carbide coating 7. In this way, in terms of process, such an embodiment discloses a competitive gain in the cost requirement.

In a preferred embodiment, the CVD process is carried out at a temperature substantially between 450° C. and 650 C, much more reduced as compared with the temperatures usually employed in this type of process (1000° C.), guaranteeing that there is no damage to the substrate 9 (valve) by exposure to very high temperatures. The coating 7 is obtained by chemical reaction of gases, namely: tungsten hexafluoride as the gas that supplies the metal, hydrogen gas as the reactive gas and a gas such as propane or methane, which serves as a carbon source.

The combination of these gases in specific proportions, in contact with the heated substrate (valve 1) forms the coating 7, which covers it evenly.

Preferably, the above-mentioned gases are inserted in a specific proportion so that the coating 7 will have a metallic tungsten matrix containing tungsten nanocarbides WC, W2C, W3C, W12C, or a mixture thereof with thickness ranging from 5 μm to 80 μm and hardness ranging from 500 HV and 3500 HV, more preferably from 1000 HV and 2000 HV. By way of example, the hardness behavior with regard to the coating depth, up to 10, 50 and 80 microns in depth, one has 2000, 1500 and 1000 HV, respectively.

Figure 14:
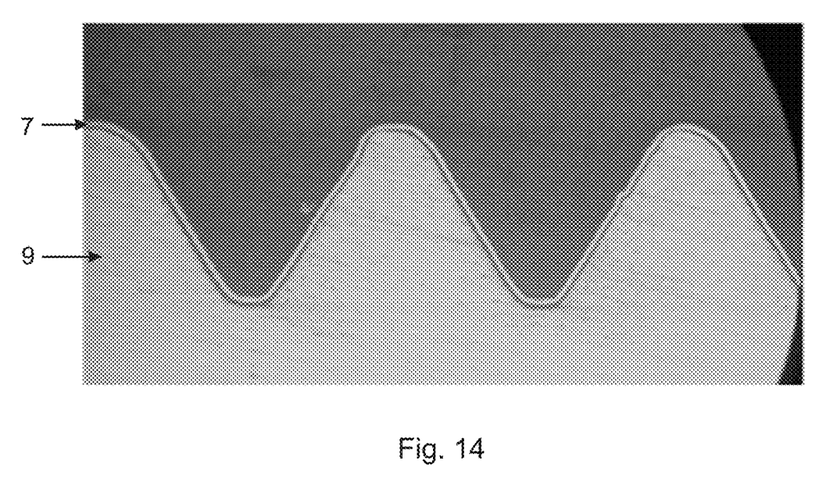
FIG. 14 shows a valve of the present invention provided with a coating having 50 micron thickness, wherein one can see that the coating follows the substrate uniformly.

It should also be noted that FIG. 14 shows a valve 1 of the present invention provided with a coating 7 having 50 micron thickness, wherein it is possible to observe that the coating 7 follows the substrate 9 uniformly, even minor imperfections being followed in perfection.

As an additional advantage, the valve 1 of the present invention enables that, by a brushing process, one will obtain excellent finish parameters, with Ra roughness lower than 0.02, which results in low friction for the rod 4 region.

Figure 11:
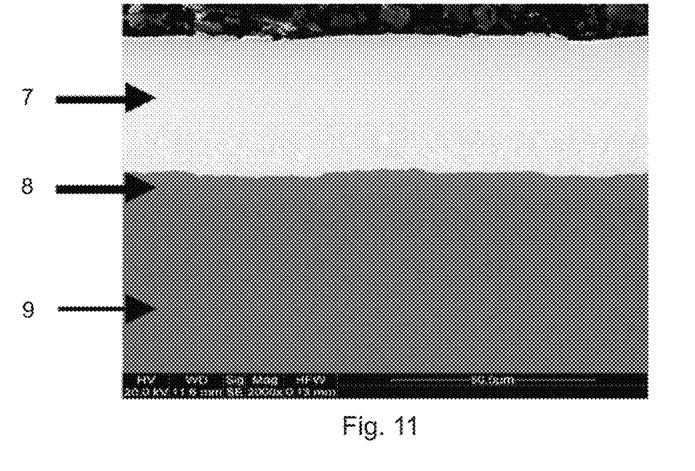
FIG. 11 represents a photograph of the tungsten carbide coating on the valve of the present invention.

Further preferably, one previously applies to the coating 7 a pure-nickel layer 8 with adhesive function (bonding layer, see FIG. 11), having preferably thickness ranging from 1 μm to 5 μm. The layer of pure nickel favors adhesion of the tungsten carbide layer formed and deposited by the CVD process, but is not compulsory.

Further according to the preferred embodiment, in a non-limiting manner, due to the reduced percent of tungsten carbide, the Young modulus (E) is about 410 (GPa), therefore similar to that of pure tungsten metal. This is an advantage over the coatings obtained by physical vapor deposition (PVD), which exhibit typical values of about 250 GPa.

As a characteristic of the tungsten carbide coating 7 formed, it exhibits hardness variation, so that the hardness on the surface is reduced according to the coating depth, the reduction being of up to 50% with respect to the hardness on the surface.

Figure 12:
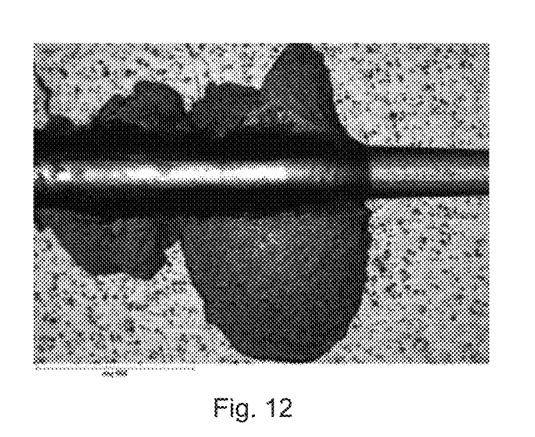
FIG. 12 represents a photograph of a prior-art valve after it has been subjected to a scratch test with 120N load, with occurrence of coating delamination.
Figure 13:
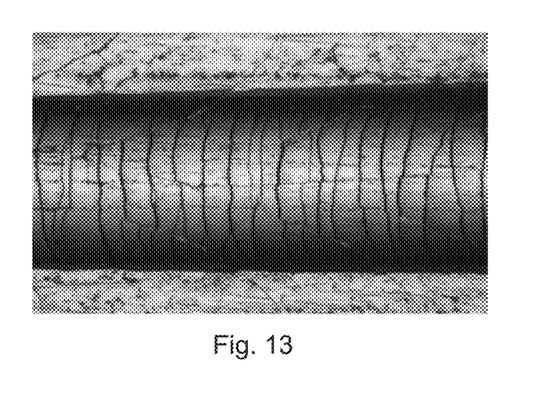
FIG. 13 represents a photograph of a prior-art valve after it has been subjected to a scratch test with a 120N load, without occurrence of delamination of the coating.

It should also be noted that the valve 1 of the present invention has managed to achieve a resistance to delamination quite superior to the prior art. FIGS. 12 and 13 show, respectively, a prior-art valve and a valve 1 of the present invention subjected to a scratch test. The prior-art valve is provided with a chrome nitride coating having with 30 microns, applied by the PVD process, and the valve 1 of the present invention is provided with a tungsten carbide coating 7 having 45 microns, applied by CVD. The figures show that the prior-art valve has undergone lamination when subjected to a 120N load, whereas the valve 1 of the present invention does not undergo any delamination, even when subjected to the maximum load which the testing machine enables, namely 180N. The results show a significant increase in the resistance of the valve 1 of the present invention, and one can conclude that the valve 1 has resistance to delamination for loads higher than 180N.

The valve 1 of the present invention has a number of advantages and benefits with respect to the presently known valves, which are:

(a) Increase in strength and excellent adhesion of the coating 7 as compared with the existing solutions;
(b) Prolongation of the useful life of the valve by deposition of the tungsten carbide coating in regions where, at present, homogeneous deposition is difficult;
(c) Use of inexpensive raw material;
(d) Increase in the hardness and thermal stability of the valve;
(e) Increase in the resistance of the valve to wear and to impact;
(f) Increase in resistance of the valve 1 to heat, chemicals and corrosion by virtue of a cohesive, dense, crackles and low-porosity coating 7; and
(g) Capability of providing a valve 1 with distinctive properties such as high resistance to corrosion and high resistance to fatigue.

Thus, through a single coating 7, the present invention manages to impart to all the actuating parts of the valve 1 the characteristics of strength and chemical resistance.

A preferred example of embodiment having been described, one should understand that the scope of the present invention embraces other possible variations, as for instance, the use of surface treatments and ceramic and metallic coatings, for the purpose of improving the characteristics of resistance to wear, corrosion and decrease in the friction forces, being limited only by the contents of the accompanying claims, which include the possible equivalents.

The invention claimed is:

1. A valve device for an internal combustion engine, comprising: a valve and a chemical vapor deposition coating of a metallic tungsten matrix material dispersed on at least a portion of the valve, the metallic tungsten matrix material containing a distribution of tungsten nanocarbides, wherein the coating includes a thickness ranging from 5 μm to 150 μm and a hardness between 500 HV and 2000 HV, wherein the coating defines an external surface facing away from at least the portion of the valve, and wherein the metallic tungsten matrix material containing the distribution of tungsten nanocarbides provides a hardness variation in the coating such that the hardness at the external surface is reduced according to a depth of the coating away from the external surface, and wherein the hardness of the coating is reduced up to 50% with respect to the hardness of the coating at the external surface.

2. The valve device according to claim 1, wherein the valve includes a rod having a head on one end and a tip on another end opposite the head, and wherein the coating is disposed on at least one of the head, a seat region of the head, a neck region of the head, the rod and the tip.

3. The valve device according to claim 1, wherein the coating is disposed on all surfaces of the valve.

4. The valve device according to claim 1, wherein the valve is an intake valve or an exhaustion valve.

5. The valve device according to claim 1, further comprising a pure-nickel bonding layer underlying the coating to facilitate adhesion of the metallic tungsten matrix material.

6. The valve device according to claim 1, wherein the CVD process is carried out at a temperature ranging from 450° C. to 650° C.

7. The valve device according to claim 1, wherein the coating includes a resistance to delamination when subjected to loads of up to 180N.

8. The valve device according to claim 1, wherein the coating has a Young modulus of 410 GPa.

9. The valve device according to claim 1, wherein the coating defines a surface including a roughness lower than Ra 0.02.

10. The valve device according to claim 1, wherein the distribution of tungsten nanocarbide includes at least one of WC, W2C, W3C and W12C.

11. The valve device according to claim 2, wherein the coating is disposed over the entirety of the rod, the head and the tip of the valve.

12. The valve device according to claim 3, further comprising a pure-nickel layer underlying the coating to facilitate adhesion of the metallic tungsten matrix material.

13. The valve device according to claim 12, wherein the coating resists delamination when subjected to loads of up to 180N.

14. The valve device according to claim 3, wherein the coating defines a surface including a roughness lower than Ra 0.02.

15. The valve device according to claim 3, wherein the coating resists delamination when subjected to loads of up to 180N.

16. The valve device according to claim 1, wherein the coating of the metallic tungsten matrix material is homogeneously dispersed on at least the portion of the valve.

17. A valve for an internal combustion engine, comprising:

a substrate and a chemical vapor deposition coating of a metallic tungsten matrix material dispersed on at least a portion of the substrate, the metallic tungsten matrix material containing a distribution of tungsten nanocarbides including at least one of WC, W2C, W3C and W12C;

wherein the coating includes a thickness between 5 μm to 150 μm, a hardness between 500 HV and 2000 HV, and a resistance to delamination when subjected to loads of up to 180N;

wherein the coating defines an external surface facing away from the substrate, wherein the metallic tungsten matrix material containing the distribution of tungsten nanocarbides provides a hardness variation in the coating such that the hardness of the coating is reduced from the external surface according to a depth of the coating, the coating depth being defined by a distance from the external surface in a direction running orthogonal to the substrate; and wherein the coating has a greater hardness at the external surface than away from the external surface along the coating depth.

* * * * *